United States Patent
Tsai et al.

(10) Patent No.: US 9,264,832 B2
(45) Date of Patent: Feb. 16, 2016

(54) MICROELECTROMECHANICAL SYSTEM (MEMS) MICROPHONE WITH PROTECTION FILM AND MEMS MICROPHONECHIPS AT WAFER LEVEL

(71) Applicant: Solid State System Co., Ltd., Hsinchu (TW)

(72) Inventors: Cheng-Wei Tsai, Taichung (TW); Chien-Hsing Lee, Hsinchu County (TW); Jhyy-Cheng Liou, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 19 days.

(21) Appl. No.: 14/066,712

(22) Filed: Oct. 30, 2013

(65) Prior Publication Data
US 2015/0118780 A1    Apr. 30, 2015

(51) Int. Cl.
*H01L 21/00* (2006.01)
*H04R 31/00* (2006.01)
*H04R 19/00* (2006.01)

(52) U.S. Cl.
CPC .............. *H04R 31/00* (2013.01); *H04R 19/005* (2013.01); *H04R 2201/003* (2013.01)

(58) Field of Classification Search
CPC ............. H04R 2201/003; H04R 31/00; H04R 19/005; H01L 2924/1461; H01L 2924/00014; B81B 2201/0257; B81B 2207/095; B81B 2207/096; B81B 7/0061
See application file for complete search history.

(56) References Cited

U.S. PATENT DOCUMENTS

| | | | | |
|---|---|---|---|---|
| 5,596,222 | A * | 1/1997 | Bernstein | 257/620 |
| 6,088,463 | A * | 7/2000 | Rombach et al. | 381/174 |
| 6,522,762 | B1 * | 2/2003 | Mullenborn et al. | 381/174 |
| 6,732,588 | B1 * | 5/2004 | Mullenborn et al. | 73/715 |
| 8,327,711 | B2 * | 12/2012 | Kasai et al. | 73/662 |
| 8,704,238 | B2 * | 4/2014 | Yang | 257/74 |
| 2005/0018864 | A1 * | 1/2005 | Minervini | B81B 7/0061 381/175 |
| 2009/0050404 | A1 * | 2/2009 | Corin | 181/279 |
| 2009/0101998 | A1 * | 4/2009 | Yen et al. | 257/416 |
| 2010/0052082 | A1 * | 3/2010 | Lee et al. | 257/416 |
| 2010/0072561 | A1 * | 3/2010 | Lee et al. | 257/415 |
| 2010/0277229 | A1 * | 11/2010 | Lee et al. | 327/540 |
| 2010/0284553 | A1 * | 11/2010 | Conti et al. | 381/174 |

(Continued)

FOREIGN PATENT DOCUMENTS

| | | |
|---|---|---|
| CN | 1387741 | 12/2002 |
| CN | 1960580 | 5/2007 |

(Continued)

OTHER PUBLICATIONS

"Office Action of China Counterpart Application", issued on Nov. 4, 2015, p. 1-p. 11, in which the listed references were cited.

*Primary Examiner* — Brett Feeney
*Assistant Examiner* — Sophia Nguyen
(74) *Attorney, Agent, or Firm* — Jianq Chyun IP Office

(57) ABSTRACT

A method to protect an acoustic port of a microelectromechanical system (MEMS) microphone is provided. The method includes: providing the MEMS microphone; and forming a protection film, on the acoustic port of the MEMS microphone. The protection film has a porous region over the acoustic port to receive an acoustic signal but resist at least an intruding material. The protection film can at least endure a processing temperature of solder flow.

12 Claims, 8 Drawing Sheets

(56) References Cited

U.S. PATENT DOCUMENTS

| | | | |
|---|---|---|---|
| 2012/0146163 A1* | 6/2012 | Ho et al. | 257/416 |
| 2012/0319219 A1* | 12/2012 | Diamond et al. | 257/416 |
| 2013/0094684 A1* | 4/2013 | Ehrenpfordt | B81C 1/0023 381/332 |
| 2013/0126991 A1* | 5/2013 | Ehrenpfordt | H01L 29/66007 257/416 |
| 2014/0004559 A1* | 1/2014 | Hill et al. | 435/34 |
| 2014/0008740 A1* | 1/2014 | Wang et al. | 257/416 |
| 2014/0037120 A1* | 2/2014 | Lim | H04R 23/00 381/355 |
| 2014/0091406 A1* | 4/2014 | Harney et al. | 257/416 |
| 2014/0270271 A1* | 9/2014 | Dehe et al. | 381/174 |
| 2014/0299948 A1* | 10/2014 | Wang et al. | 257/416 |

FOREIGN PATENT DOCUMENTS

| | | |
|---|---|---|
| CN | 201114761 | 9/2008 |
| CN | 101665230 | 3/2010 |
| CN | 202679627 | 1/2013 |
| DE | 102011086765 | 5/2013 |

* cited by examiner

MICROELECTROMECHANICAL SYSTEM (MEMS) MICROPHONE WITH PROTECTION FILM AND MEMS MICROPHONECHIPS AT WAFER LEVEL

BACKGROUND OF THE INVENTION

1. Field of Invention

The present invention relates to microelectromechanical system (MEMS) microphone. More particularly, the present invention relates to the MEMS microphone with protection film from water, dust, et al.

2. Description of Related Art

MEMS chip, such as MEMS microphone, has a sensing diaphragm to sense the vibration of air pressure caused by acoustic signal, for example. The sensing diaphragm forms as a part of a sensing capacitor, so that the acoustic signal can be converted into electric signal.

FIG. 1 is a cross-sectional drawing, schematically illustrating a conventional MEMS chip. In FIG. 1, generally, a MEMS chip, such as a MEMS microphone, with diaphragm 58 is shown. The MEMS chip has a semiconductor substrate 40 and a dielectric structural layer 50 on the silicon substrate 40. The semiconductor substrate 40 has a cavity 44 and several venting holes 48 in the active region 46, which also serving a fixed electrode of a MEMS capacitor. The cavity 44 is connected with the chamber between the diaphragm 58 and the substrate 40 by the venting holes 48, so that the diaphragm can vibrates with the acoustic signal, which is usually received by the cavity 44. The dielectric structural layer 50 holds the diaphragm 58. The diaphragm 58 senses the acoustic signal. The other circuit part 54 is also formed in the dielectric structural layer 50. In fabrication, the dielectric structural layer 50 includes dielectric layer 52 and an etching stop layer 56 in multiple fabrication steps, to form the diaphragm 58 and the circuit part 54. The A person with ordinary skill in the art can understand how the MEMS structure is formed by the fabrication process in multiple steps.

Generally, the MEMS chip is divided into two parts of backplate and diaphragm. Referring to FIG. 1, the basic structure of the backplate includes the substrate 40 and the diaphragm is formed in the dielectric structural layer 50. In the following descriptions, the MEMS chip is then generally indicated by backplate and diaphragm as the two characteristic structures without showing the detail structure.

FIG. 2 is a drawing of cross-sectional view, schematically illustrating a conventional MEMS microphone. In FIG. 2, the MEMS chip 100 includes the backplate 102 and the diaphragm 104. The backplate 102 has a cavity 106 at one side to receive acoustic signal. The diaphragm 104 is disposed over the backplate 102 at a side opposite to the cavity. The backplate has a venting-hole layer 108 with multiple venting holes. A chamber is formed between the venting-hole layer 108 and the diaphragm 104, in which the space of the chamber is connected with the space of the cavity 106 by the venting holes. The MEMS chip 100 may be further implemented with a cap structure 110 as a MEMS microphone, in which the cap structure 110 can be formed over the diaphragm 104 by the adhesive layer 112, such as the glue layer. The cap structure 110 also has an auxiliary chamber 110a, so as to help the vibration of the diaphragm 104 in response to the acoustic signal received from the cavity 106.

FIG. 3 is a drawing of cross-sectional view, schematically illustrating a conventional MEMS microphone. In FIG. 3, another type of the conventional MEMS microphones in different structure may include a packaging board 120. A MEMS chip 100 and an application-specific integrated circuit (ASIC) 122 are disposed on the packaging board 120 and are electrically bounded by, for example, bonding wires or other bonding technology known in the art. Then a cap structure 114 on the packaging board 120 covers over the MEMS chip 100 and the ASIC 122. In order to receive the acoustic signal, the cap structure 114 has an acoustic port 116 to receive the acoustic signal. The auxiliary chamber 118 inside the cap structure 114 allows the diaphragm for more-easily vibrating with the acoustic signal.

FIG. 4 is a drawing of cross-sectional view, schematically illustrating a conventional MEMS chip. In FIG. 4, another type of the conventional MEMS microphones in different structure may include a packaging board 120. The packaging board 120 has an acoustic port 116. A MEMS chip 100 and an ASIC 122 are disposed on the packaging board 120 and are electrically bounded by, for example, bonding wires. However, the cavity of the MEMS chip 100 is matched to the acoustic port 116 of the packaging board 120, so the cavity can receive the acoustic signal. A cap structure 114 on the packaging board 120 covers over the MEMS chip 100 and the ASIC 122. In this situation, the cap structure 114 may need not the acoustic port. The auxiliary chamber 118 inside the cap structure 114 allows the diaphragm for more-easily vibrating with the acoustic signal.

The conventional MEMS chip can be designed in various manners, but not limited to the types described above. It should be noted that the vibration amplitude of the diaphragm would determine the sensitivity. However, the conventional MEMS chip during the subsequent fabrication processes, such as the process to packaging in circuit board, may receive intruding material between the diaphragm and the venting-hole layer and then reduce the performance of the diaphragm.

SUMMARY OF THE INVENTION

The disclosure provides MEMS microphone with protection film. The protection film can receive the acoustic signal but resist at least an intruding material. The performance of the diaphragm can maintain, reducing the effect caused by the intruding material.

In an embodiment, a method to protect an acoustic port of a microelectromechanical system (MEMS) microphone is provided. The method includes: providing the MEMS microphone; and forming a protection film, on the acoustic port of the MEMS microphone. The protection film has a porous region over the acoustic port to receive an acoustic signal but resist at least an intruding material. The protection film can at least endure a processing temperature of solder flow.

In an embodiment, a method to form microelectromechanical system (MEMS) microphones at wafer level comprises: Ruining a plurality of MEMS microphones on a wafer, wherein each of the MEMS microphones has a cavity or an acoustic port to receive an acoustic signal; and forming a protection film, disposed over the wafer, covering the acoustic port or the cavity of each of the MEMS microphones. The protection film has a porous region over the acoustic port or the cavity to receive the acoustic signal but resist at least an intruding material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

In the disclosure, multiple embodiments of MEMS microphone are provided for descriptions. However, the present invention is not limited to the embodiments provided.

For a MEMS microphone, a protection film is proposed to be formed with MEMS chip as the MEMS microphone. The MEMS microphone can be MEMS microphone or a MEMS chip with diaphragm to detect acoustic signal, for example.

Figure 5:
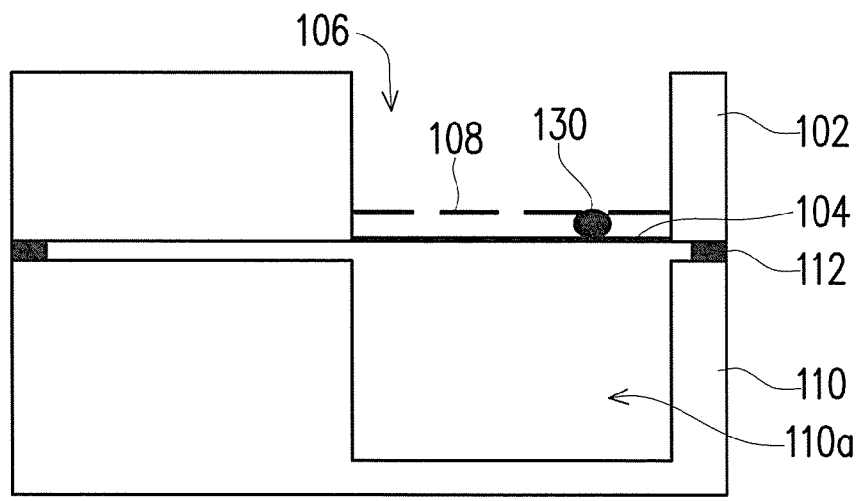
FIG. 5 is a drawing of cross-sectional view, schematically illustrating a mechanism considered in the invention about affecting the performance of MEMS chip.

The performance of a MEMS chip with diaphragm to detect variance of air pressure caused by the acoustic signal is very depending on the capability of vibration of the diaphragm. If the diaphragm of the MEMS chip cannot vibrate with the acoustic signal at the required sensibility, the performance of the MEMS chip is reduced or even failed. FIG. 5 is a drawing of cross-sectional view, schematically illustrating a mechanism considered in the invention about affecting the performance of MEMS chip.

Figure 1:
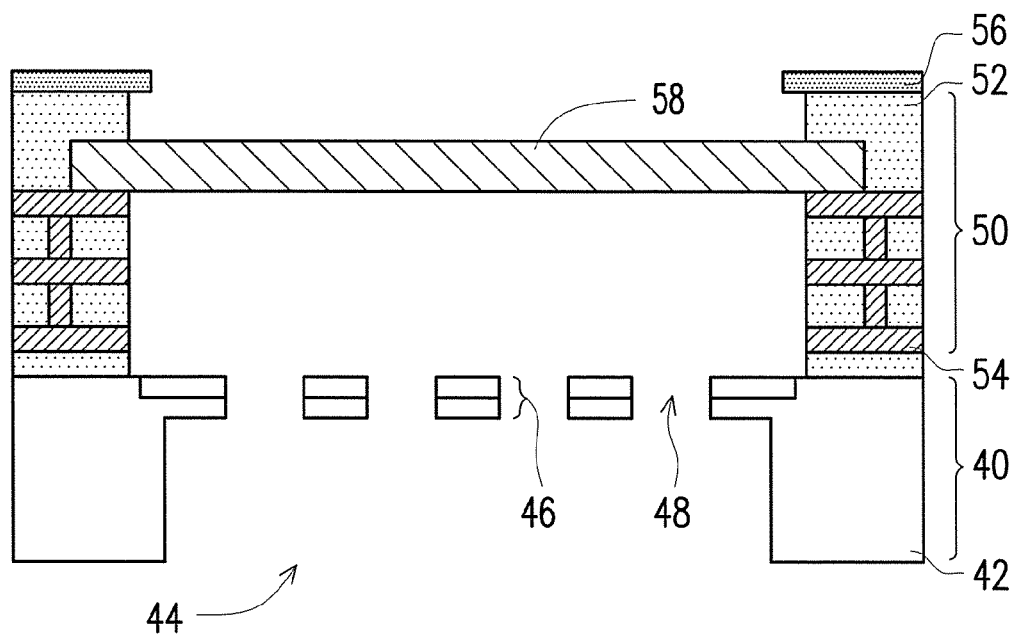
FIG. 1 is a process flow diagram, schematically illustrating a face detection method according to a preferred embodiment of the invention.
Figure 2:
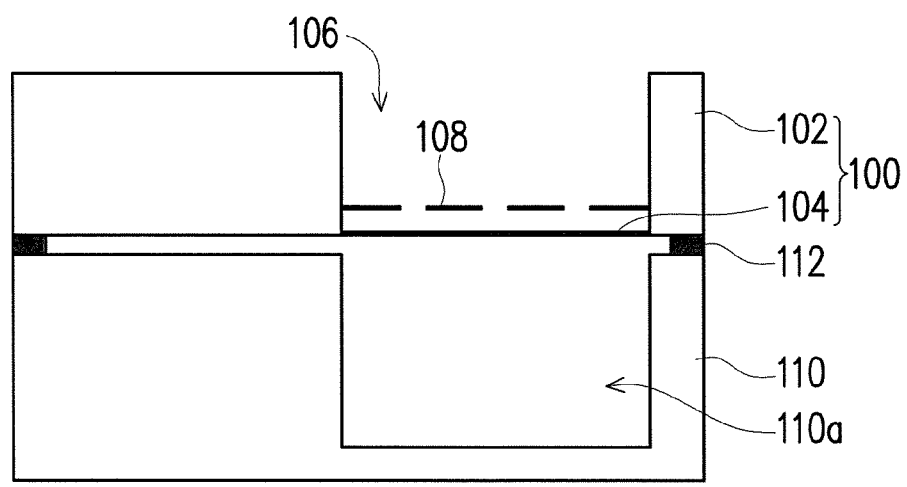
FIG. 2 is a drawing of cross-sectional view, schematically illustrating a conventional MEMS microphone.

In FIG. 5, as investigated in the invention, the performance of a conventional MEMS chip, such as the MEMS microphone in FIG. 2, may be reduced because the intruding material 130 may enter the space between the diaphragm 104 and the venting-hole layer 108, and reduce the capability of vibration of the diaphragm 104. The intruding material 130 may be any one of dust, liquid, water, et al., which may enter the MEMS chip in later application, particularly during the subsequent fabrication process, for example. In the structure of FIG. 5 as an example, the intruding material 130 first enters from the cavity 106 of the MEMS chip and then enters the space between the diaphragm 104 and the venting-hole layer 108 of the backplate 102 when the cap structure 110 is glued on the MEMS chip by the glue layer 112. Here, the cavity 106 may also be referred as an acoustic port.

Figure 6A:
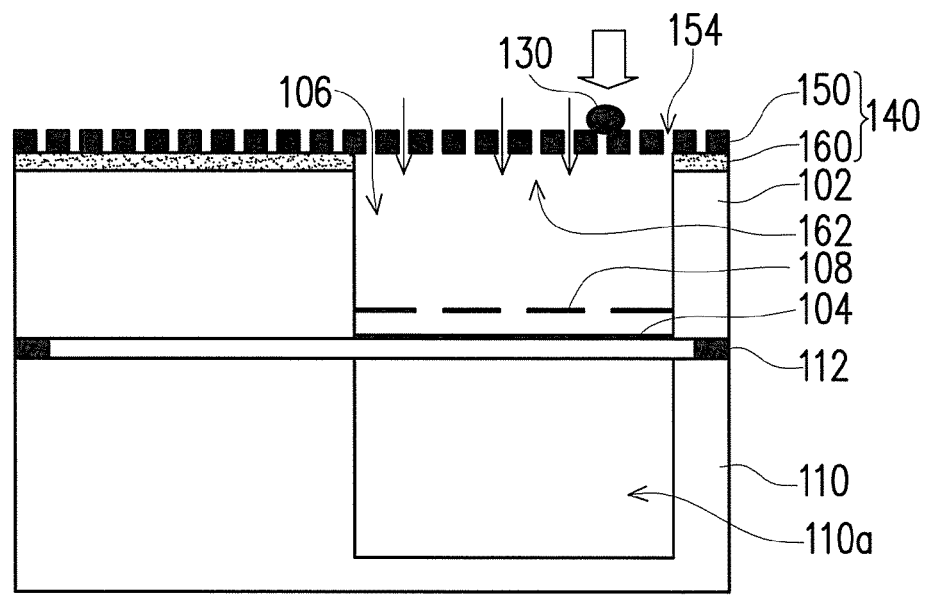
FIGS. 6A-6B are drawings of cross-sectional view and top view, schematically illustrating a structure of MEMS microphone, according to an embodiment of the invention.
Figure 6B:
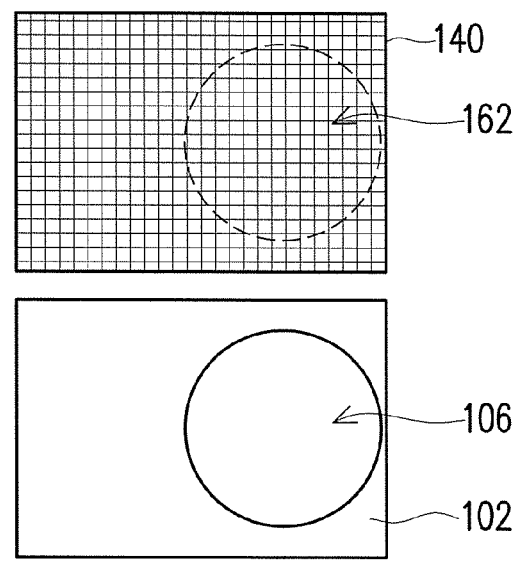

FIGS. 6A-6B are drawings of cross-sectional view and top view, schematically illustrating a structure of MEMS microphone, according to an embodiment of the invention. In FIG. 6A, the MEMS microphone includes a MEMS microphone, like the one in FIG. 2. In order to prevent the intruding material 130 from entering into the space between the diaphragm 104 and the venting-hole layer as shown in FIG. 5. Basically, the MEMS microphone of the embodiment includes a MEMS chip, which has a backplate 102 and a diaphragm 104. The backplate 102 has a venting-hole layer 108 and a cavity 106 at a first side to receive an acoustic signal. The diaphragm 104 is disposed over the backplate 102 at a second side opposite to the second side. A protection film 140 is disposed on the first side of the backplate 102, covering over the cavity 106. The protection film 140 has a porous region over the cavity 106 to receive the acoustic signal but resist at least an intruding material 130 from the environment as indicated by arrow. The cap structure 110 is adhered over the backplate 102 over the diaphragm 104 from the other side. The cap structure 110 has the auxiliary chamber 110a to allow the diaphragm to be more-easily vibrated with the acoustic signal.

In FIG. 6B, the top views for the MEMS chip and the protection film 140 are also shown. The cavity 106 is covered by the protection film 140. The protection film 140, as shown in FIG. 6A and FIG. 6B, includes an adhesive layer 160 and a protection layer 150. The adhesive layer 160 is disposed on the backplate 102 at the first side. The adhesive layer 160 has an opening 162 for exposing the cavity 106 of the backplate 102. In the embodiment, the opening 162 may be precisely aligned to the cavity 106. However, it is not absolutely required to precisely align the opening 162 to the cavity 106. A rough alignment in FIG. 8 as another embodiment will be described later. The protection layer 150 is disposed on the adhesive layer 160, in which the protection layer 150 has the porous region with a plurality of acoustic holes 154 over the opening 162 to receive the acoustic signal but resist the intruding material 130.

It can be noted that the protection film 140 compposited with the adhesive layer 160 and the protection layer 150 may be separately formed and then adhered to the backplate 102. It can also be noted that the porous region of the protection layer 150 may be just a part region over the cavity 106. However, for easy fabrication, the protection layer 150 may be a mesh layer with the acoustic holes 154. Alternatively, the protection layer 150 may be a glass-fiber layer to for the mesh layer, in which the multiple spaces between the glass fibers foci the acoustic holes 154 to allow the acoustic signal to passes. However, if the size of the acoustic holes 154 is too small, a portion of the acoustic signal may be blocked, so the size in width of the acoustic holes 154 may be at least half of the wavelength of the acoustic signal or larger. However, the size should be smaller than the size of the venting holes of the venting-hole layer 108 to resist the possible intruding material 130.

Further, the protection layer 150 and the adhesive layer 160 should also be able to endure the operation temperature of solder flow during subsequent fabrication process to form the electronic apparatus. The max. solder flow is 260° C. In an embodiment, the protection layer 150 and the adhesive layer 160 can at least endure a processing temperature of solder flow of 260° C.

Figure 7A:
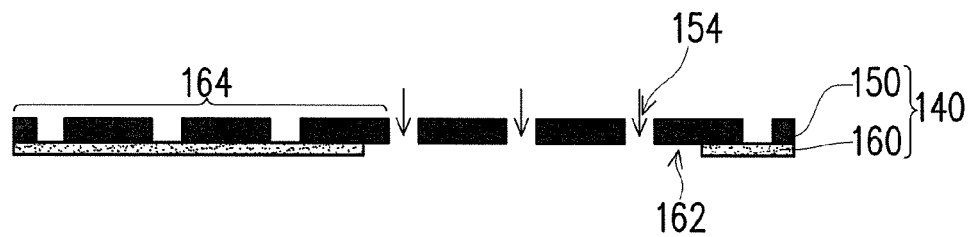
FIGS. 7A-7B are drawings of cross-sectional view and top view, schematically illustrating a structure of protection film of the MEMS microphone, according to an embodiment of the invention.
Figure 7B:
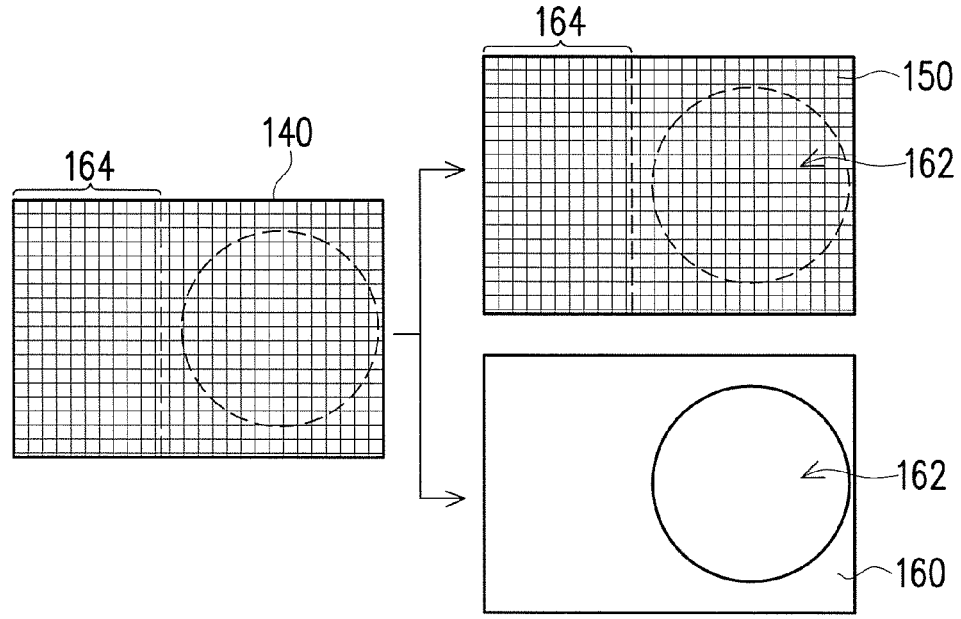

FIGS. 7A-7B are drawings of cross-sectional view and top view, schematically illustrating a structure of protection film of the MEMS microphone, according to an embodiment of the invention. In FIG. 7A and FIG. 7B, the protection film 140 may be formed separately from the fabrication of the MEMS microphones. However, it is not the only way to fabricate the protection film 140. The protection 150 may be a mesh layer formed by glass-fiber layer with the acoustic holes 154 to allow the acoustic signal, as indicated by arrows, to pass the acoustic holes 154. Here, the effect region is corresponding to the opening 162 of the adhesive layer 160, so the region 164 other then the opening 162 may need no the acoustic holes 154. However, for easy fabrication, the protection layer 150 may be a mesh layer in full region as an embodiment. In addition, the protection film 140 includes the protection layer 150 and the adhesive layer 160 together, each of which is also shown in FIG. 7B in top view. The protection layer 150, as an example, is a glass-fiber mesh layer. The adhesive layer 160 may be a glue layer but there is the opening 162, which is corresponding to the cavity of the MEMS microphone in the embodiment.

Figure 8:
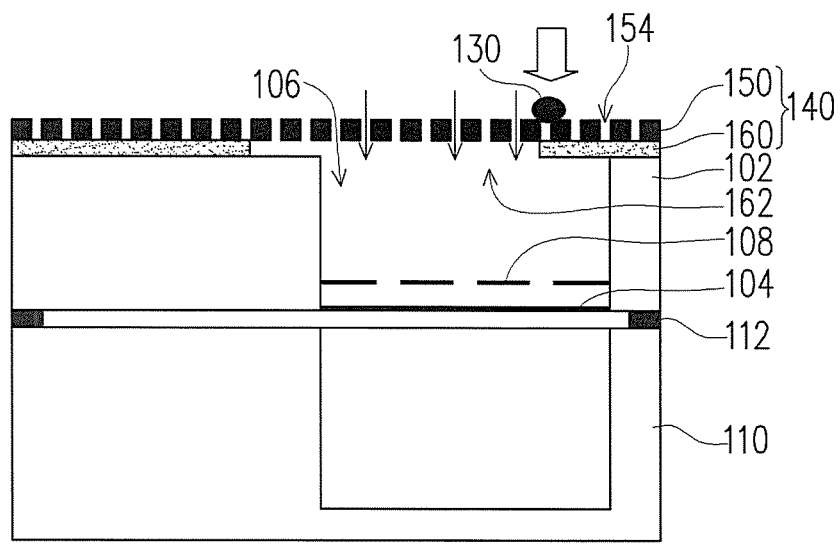
FIG. 8 is a drawing of cross-sectional view, schematically illustrating a structure of MEMS microphone, according to another embodiment of the invention.

FIG. 8 is a drawing of cross-sectional view, schematically illustrating a structure of MEMS microphone, according to another embodiment of the invention. In FIG. 8, in comparing with FIG. 6A, the adhesive layer 160 of the protection layer 140 has the opening 162, which is not precitely aligned with the cavity 106 of the backplate 102. However, since the opening 162 still exposes the cavity, it still has sufficient number of acoustic holes 154 to let the acoustic signal pass but the intruding material 130 is effectively resisted to enter the cavity 106.

Figure 3:
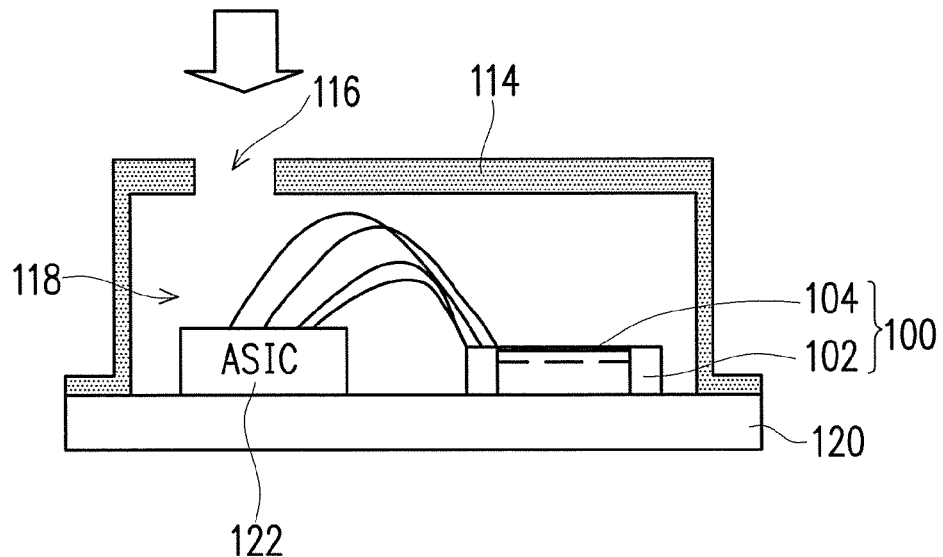
FIG. 3 is a drawing of cross-sectional view, schematically illustrating a conventional MEMS microphone.
Figure 4:
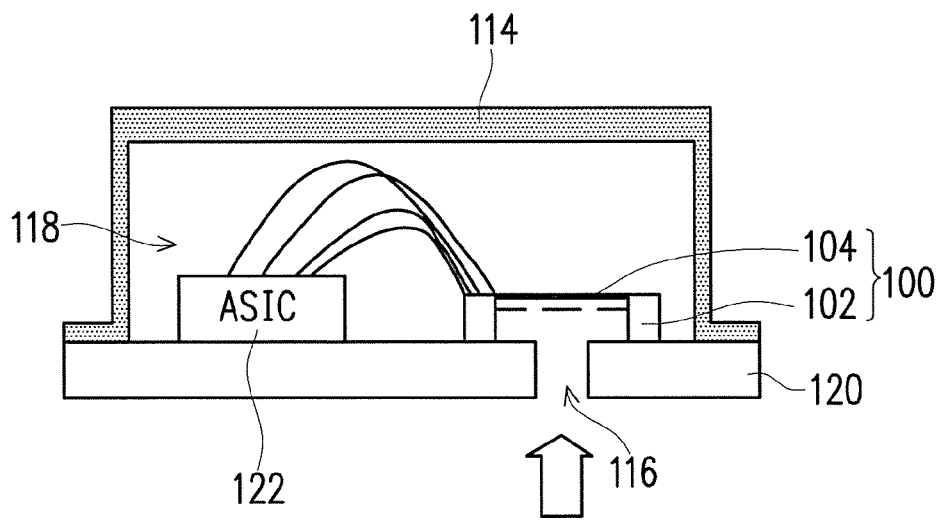
FIG. 4 is a drawing of cross-sectional view, schematically illustrating a conventional MEMS chip.
Figure 9:
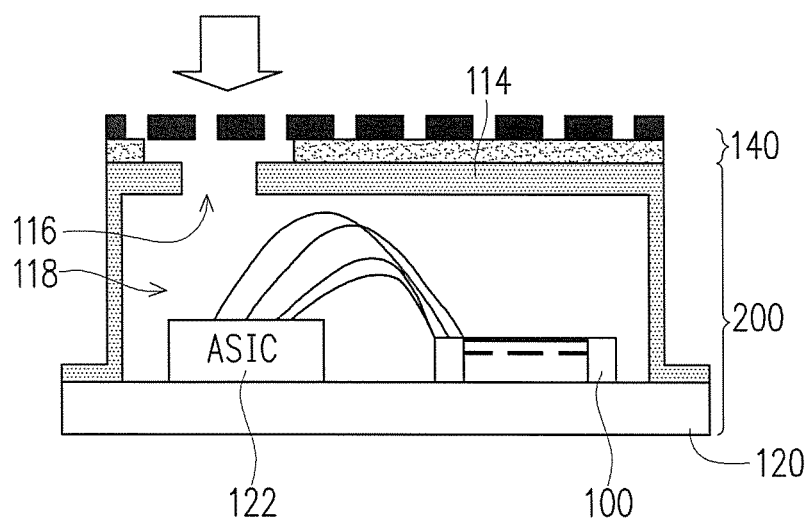
FIG. 9 is a drawing of cross-sectional view, schematically illustrating a structure of MEMS microphone, according to another embodiment of the invention.

FIG. 9 is a drawing of cross-sectional view, schematically illustrating a structure of MEMS microphone, according to another embodiment of the invention. In FIG. 9, the MEMS microphone 200 is based on the conventional MEMS microphone in FIG. 3. The ASIC 122 and the MEMS chip 100 are disposed on the packaging board 120. The cap structure 114 is also disposed on the packaging board 120 to cover the ASIC 122 and the MEMS chip 100. The acoustic port 116 of the cap structure 114 receives acoustic signal. However, the intruding material would be resisted by the protection film 140, which is disposed on the cap structure 114 to cover the acoustic port 116.

Figure 10:
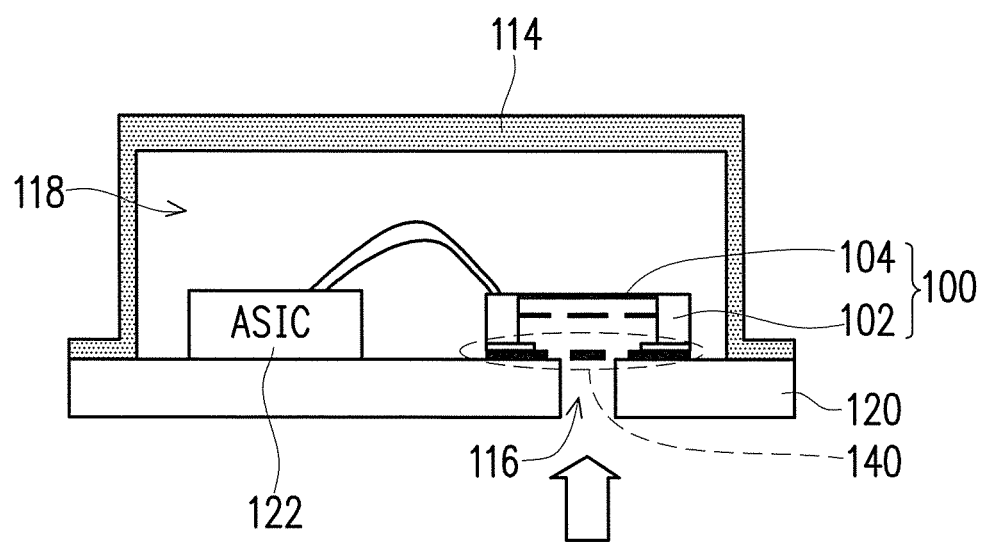
FIG. 10 is a drawing of cross-sectional view, schematically illustrating a structure of MEMS microphone, according to another embodiment of the invention.

FIG. 10 is a drawing of cross-sectional view, schematically illustrating a structure of MEMS microphone, according to another embodiment of the invention. In FIG. 10, the packaging board 120 has an acoustic port 116. The MEMS chip 100 and the ASIC 122 are disposed on the packaging board 120 and are electrically bounded by, for example, bonding wires.

It should be noted that the MEMS chip 100 has been implement with the protection film 140, as shown in FIG. 6A and FIG. 6B. The cavity of the MEMS chip 100 is matched to the acoustic port 116 of the packaging board 120, so the MEMS chip 100 can receive the acoustic signal from the acoustic port 116 but the intruding material may be resisted by the protection film 140. In this embodiment, the cap structure 114 may need no another acoustic port. However, if the cap structure 114 in FIG. 9 is taken, another protection film may also be implemented.

With the aspect of the protection film, used in the MEMS microphone, when the MEMS microphones is at the semi-finished stage, such as the wafer-level stage, the protection film have already applied to the MEMS microphones.

Figure 11:
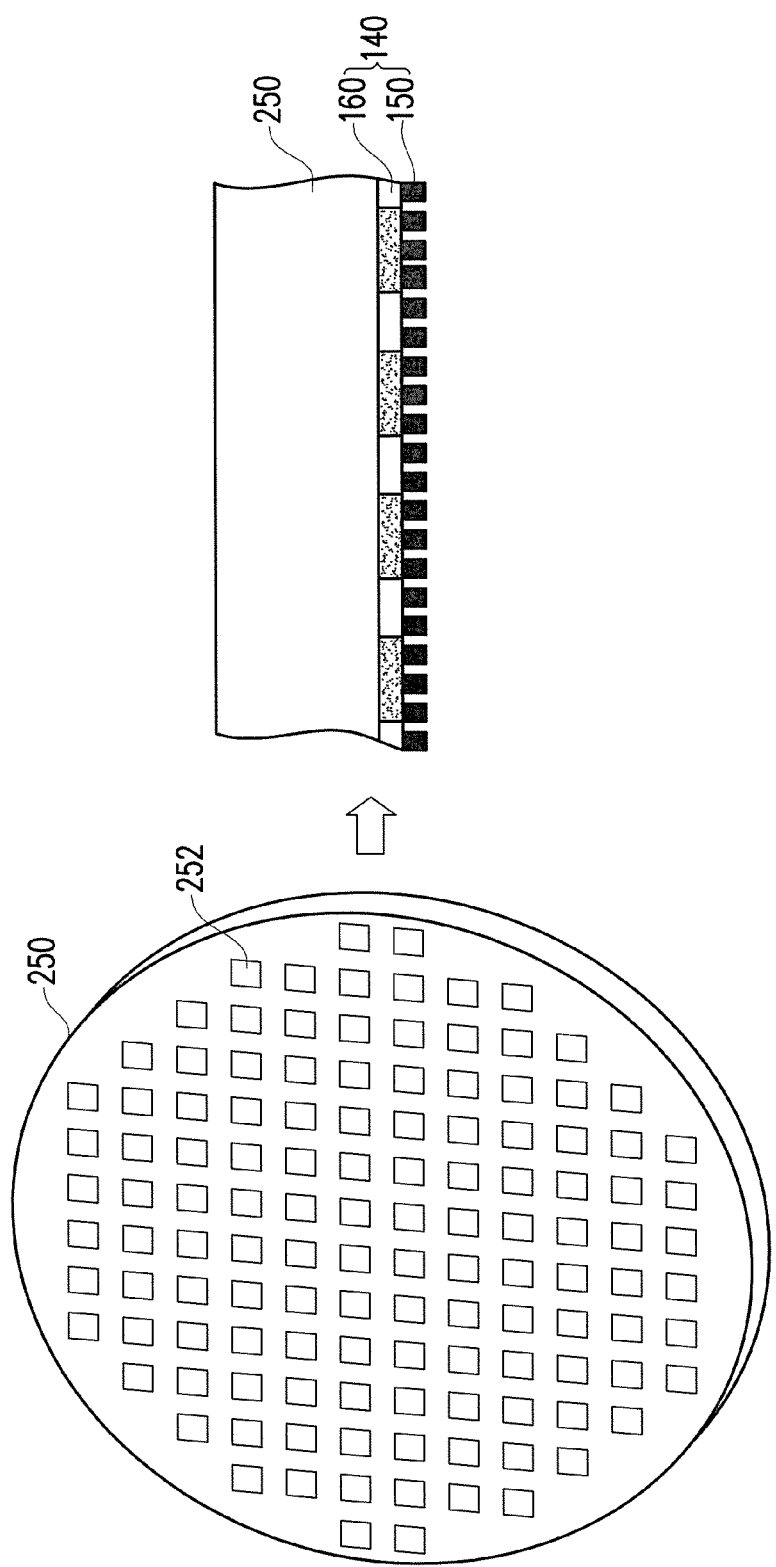
FIG. 11 is a drawing, schematically illustrating a structure of MEMS microphone at wafer level, according to another embodiment of the invention.

FIG. 11 is a drawing, schematically illustrating a structure of MEMS microphone at wafer level, according to another embodiment of the invention. In FIG. 11, the MEMS microphones in semi-finished stage of wafer level, multiple MEMS units 252 with the MEMS chip to be cut into MEMS microphones have already been formed on the wafer 250. Then, the protection film 140 is formed over the MEMS units 252. Here, the MEMS units 252 may be one of the structures shown in FIGS. 6A-6B, 8, 9 and 10, or even other conventional MEMS microphone not described in the disclosure.

Figure 12:
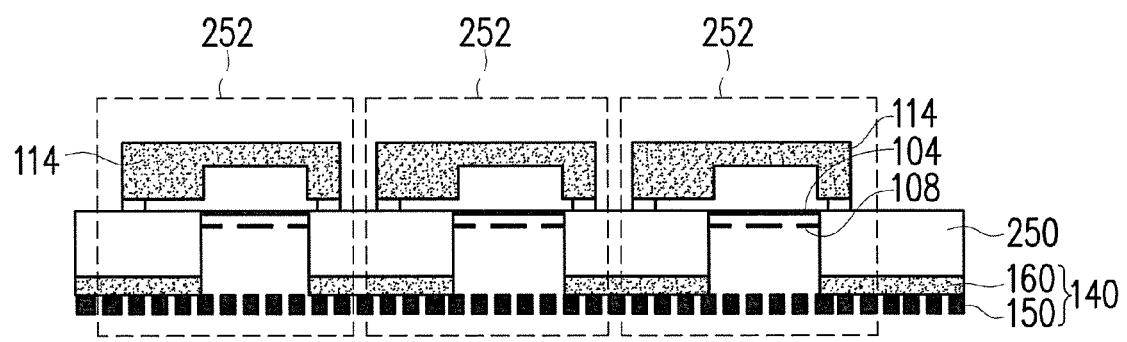
FIG. 12 is a drawing of cross-sectional view, schematically illustrating a structure of MEMS microphone at wafer level, according to another embodiment of the invention.

FIG. 12 is a drawing of cross-sectional view, schematically illustrating a structure of MEMS microphone at wafer level, according to another embodiment of the invention. Taking the MEMS microphone shown in FIG. 6A as the example, in FIG. 12, the wafer 250, serving as the backplate, has been formed with the venting-hole layers 108 and diaphragm 104 within each MEMS units 252, which is to be cut into MEMS microphones later. The cap structures 114 have also formed over the wafer 250 in each MEMS units 252. Usually, the process to cut the wafer into MEMS microphones may produce a big amount of dust and involving auxiliary materials, such as cooling water or any other liquid, which are main part of the intruding material. The protection film 140 is formed before cutting the MEMS units 252 at the wafer level stage, so can at least effectively prevent the intruding material from entering into the MEMS chips 100.

The protecting film 140 has been proposed in use for particularly fabricating the MEMS chip. The intruding material can be effectively resisted to enter the MEMS chip. Even in later application of the MEMS microphone in other electronic apparatus, the protection film can still effectively prevent the intruding material into the MEMS chip.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method to protect an acoustic port of a microelectromechanical system (MEMS) microphone, comprising:
   providing the MEMS microphone, wherein the MEMS microphone has a MEMS chip with a backplate and the backplate has a venting-hole layer with a plurality of venting holes; and
   forming a protection film, on the acoustic port of the MEMS microphone, wherein the protection film has a porous region with a plurality of acoustic holes over the acoustic port to receive an acoustic signal but the acoustic holes are smaller than the venting holes to resist at least an intruding material to pass the venting holes, wherein the protection film can at least endure a processing temperature of solder flow.

2. The method of claim 1, wherein the step of forming the protection film comprises:
   forming an adhesive layer on the MEMS microphone at a side having the acoustic port, wherein the adhesive layer has an opening for exposing the acoustic port; and
   forming a protection layer on the adhesive layer, wherein the protection layer at the porous region has the acoustic holes to receive the acoustic signal but resist the intruding material.

3. The method of claim 2, wherein the protection layer is a mesh layer.

4. The method of claim 3, wherein the protection layer is a glass-fiber layer, the protection layer and the adhesive layer can at least endure a processing temperature of solder flow.

5. The method of claim 1, wherein the MEMS microphone as provided comprises:

the MEMS chip, the MEMS chip further having a diaphragm, wherein the backplate also has a cavity as the acoustic port at a first side to receive the acoustic signal, wherein the diaphragm is disposed over the backplate at a second side opposite to the first side; and a cap structure, covering over the diaphragm of the MEMS chip, wherein the cap structure has an auxiliary chamber, also exposing the diaphragm.

6. The method of claim 1, wherein the MEMS microphone as provided comprises:

the MEMS chip, having a cavity;

a packaging board, having the acoustic port, wherein the protection film is disposed on the packaging board, and the cavity is also aligned to the acoustic port, so that the acoustic signal can enter the cavity of the MEMS chip through the acoustic port; and a cap structure, disposed on the packaging board, covering over the MEMS chip.

7. The method of claim 1, wherein the microphone device as provided comprises:

a packaging board;

the MEMS chip, disposed on a side of the packaging board, the MEMS chip further has a diaphragm; and a cap structure, disposed on the side of the packaging board, covering over the MEMS chip, wherein the cap structure has the acoustic port to receive the acoustic signal, which is transmitted to the MEMS chip inside the cap structure.

8. A method to form microelectromechanical system (MEMS) microphones at wafer level, comprising:

forming a plurality of MEMS microphones on a wafer, wherein each of the MEMS microphones has a cavity or an acoustic port to receive an acoustic signal; and forming a protection film, disposed over the wafer, covering the acoustic port or the cavity of each of the MEMS microphones, wherein the protection film has a porous region with a plurality of acoustic holes over the acoustic port or the cavity to receive the acoustic signal, wherein the MEMS micro hone has a MEMS chip with a backplate and the backplate has a venting-hole layer with a plurality of venting holes, wherein the acoustic holes are smaller than the venting holes to resist at least an intruding material to pass the venting holes.

9. The method of claim 8, wherein the step of forming the protection film comprises:

forming an adhesive layer, at a periphery of the acoustic port or the cavity, wherein the adhesive layer has an opening for exposing the acoustic port; and forming a protection layer, disposed on the adhesive layer, wherein the protection layer at the porous region has the acoustic holes to receive the acoustic signal but resist the intruding material, wherein the protection layer and the adhesive layer can at least endure a processing temperature of solder flow.

10. The method of claim 9, wherein the protection layer is a mesh layer.

11. The method of claim 10, wherein the protection layer is a glass-fiber layer.

12. The method of claim 8, further comprising a cutting process to separate the MEMS microphones into a plurality of single-unit MEMS microphones; wherein the protection film is also cut with the single-unit MEMS microphones.

* * * * *